United States Patent
Tanaka et al.

(10) Patent No.: US 8,278,136 B2
(45) Date of Patent: Oct. 2, 2012

(54) SEMICONDUCTOR DEVICE, METHOD FOR PRODUCING THE SAME, SENSOR AND ELECTRO-OPTICAL DEVICE

(75) Inventors: Atsushi Tanaka, Ashigarakami-gun (JP); Kenichi Umeda, Ashigarakami-gun (JP); Kohei Higashi, Ashigarakami-gun (JP); Maki Nangu, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 75 days.

(21) Appl. No.: 12/474,931

(22) Filed: May 29, 2009

(65) Prior Publication Data

US 2009/0294765 A1    Dec. 3, 2009

(30) Foreign Application Priority Data

May 30, 2008   (JP) .................................. 2008-143255

(51) Int. Cl.
- H01L 51/40 (2006.01)
- H01L 21/00 (2006.01)
- H01L 21/44 (2006.01)
- B05D 5/12 (2006.01)
- C23C 14/30 (2006.01)

(52) U.S. Cl. .......... 438/99; 438/104; 438/151; 438/158; 438/674; 438/677; 257/E21.411; 257/E21.575; 257/E21.592; 427/110; 427/596; 505/474

(58) Field of Classification Search ............. 438/99, 438/104, 151, 158, 674, 677; 257/E21.411, 257/E21.575, E21.592; 427/110, 596; 505/474
See application file for complete search history.

(56) References Cited

U.S. PATENT DOCUMENTS

| | | | | |
|---|---|---|---|---|
| 5,212,148 | A * | 5/1993 | Roas et al. | 505/474 |
| 7,682,867 | B2 * | 3/2010 | Hirai | 438/99 |
| 7,745,267 | B2 * | 6/2010 | Cheng et al. | 438/149 |
| 7,884,360 | B2 * | 2/2011 | Takechi et al. | 257/57 |
| 2005/0180481 | A1 * | 8/2005 | Kaneko et al. | 372/50.21 |
| 2008/0299702 | A1 * | 12/2008 | Son et al. | 438/104 |
| 2009/0325341 | A1 * | 12/2009 | Itagaki et al. | 438/104 |
| 2010/0140612 | A1 * | 6/2010 | Omura et al. | 257/43 |

FOREIGN PATENT DOCUMENTS

JP    2007-142196 A    6/2007

* cited by examiner

*Primary Examiner* — Charles Garber
*Assistant Examiner* — Ron Pompey
(74) *Attorney, Agent, or Firm* — Sughrue Mion, PLLC

(57) ABSTRACT

A gate electrode, a gate insulation film and an inorganic oxide film are formed in this order on a substrate, and a source electrode and a drain electrode are formed to partially cover the inorganic oxide film. Then, oxidation treatment is applied to reduce the carrier density at a region of the inorganic oxide film which is not covered by the electrodes and is used as a channel region of a semiconductor device.

12 Claims, 6 Drawing Sheets

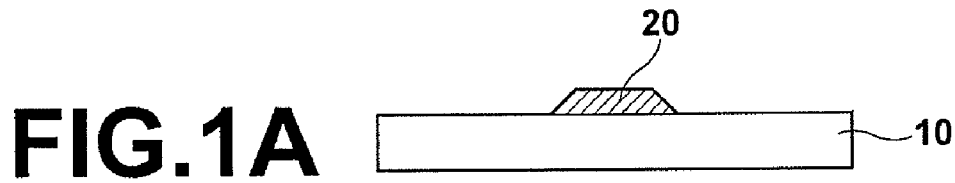
FIG.1A
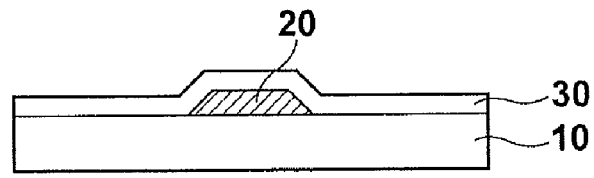
FIG.1B
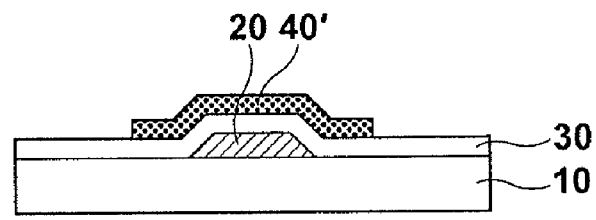
FIG.1C
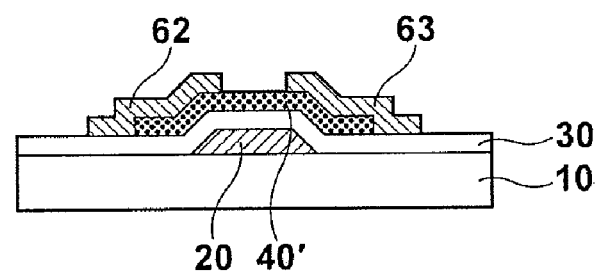
FIG.1D
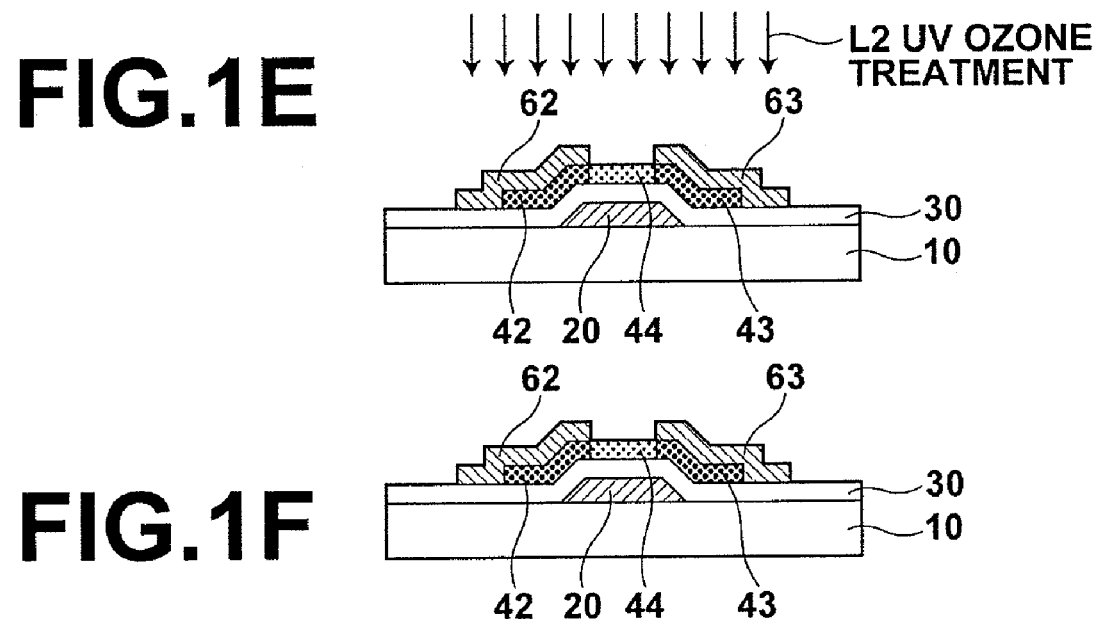
FIG.1E
FIG.1F

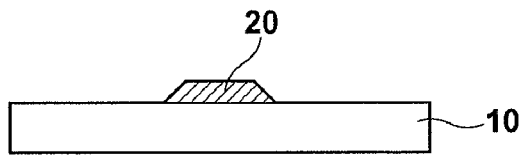
FIG.2A
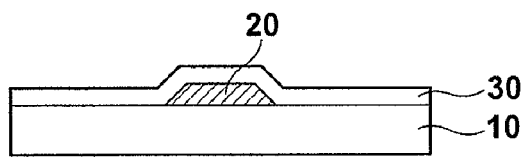
FIG.2B
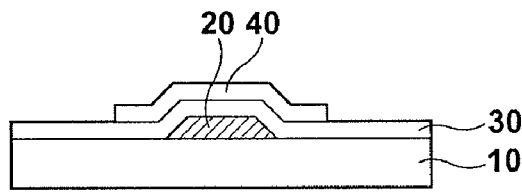
FIG.2C
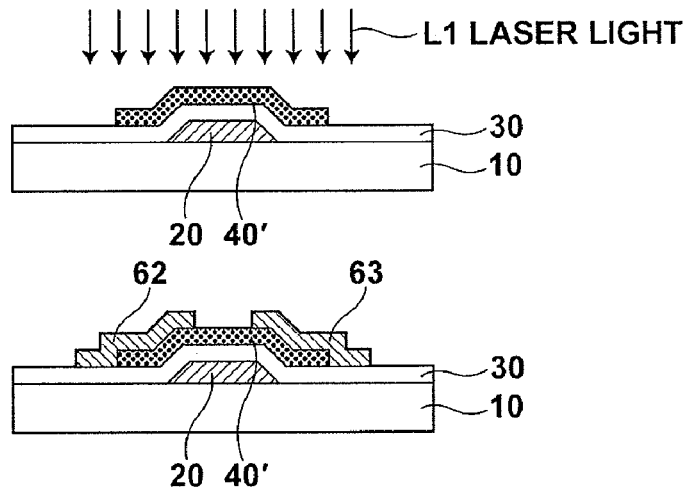
FIG.2D
FIG.2E
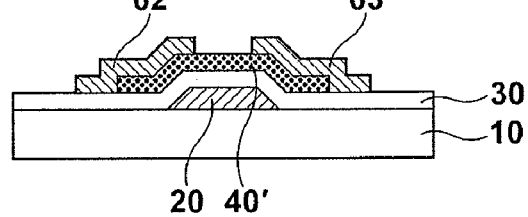
FIG.2F
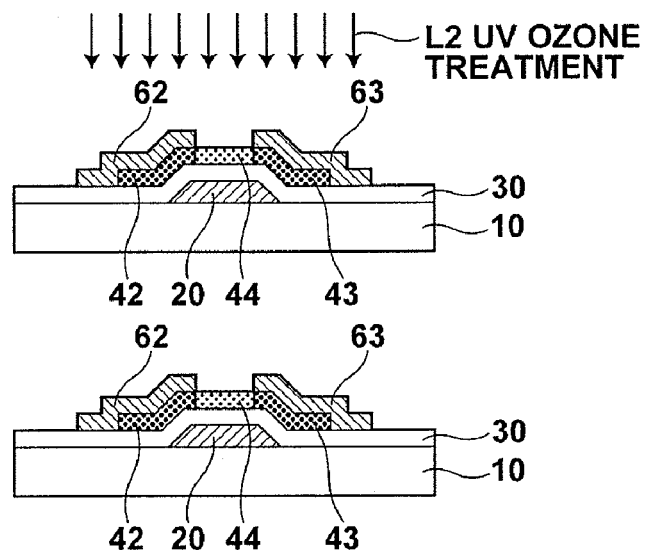
FIG.2G

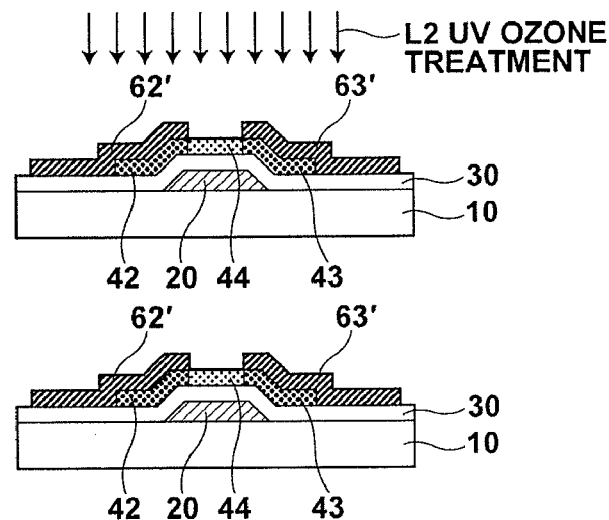

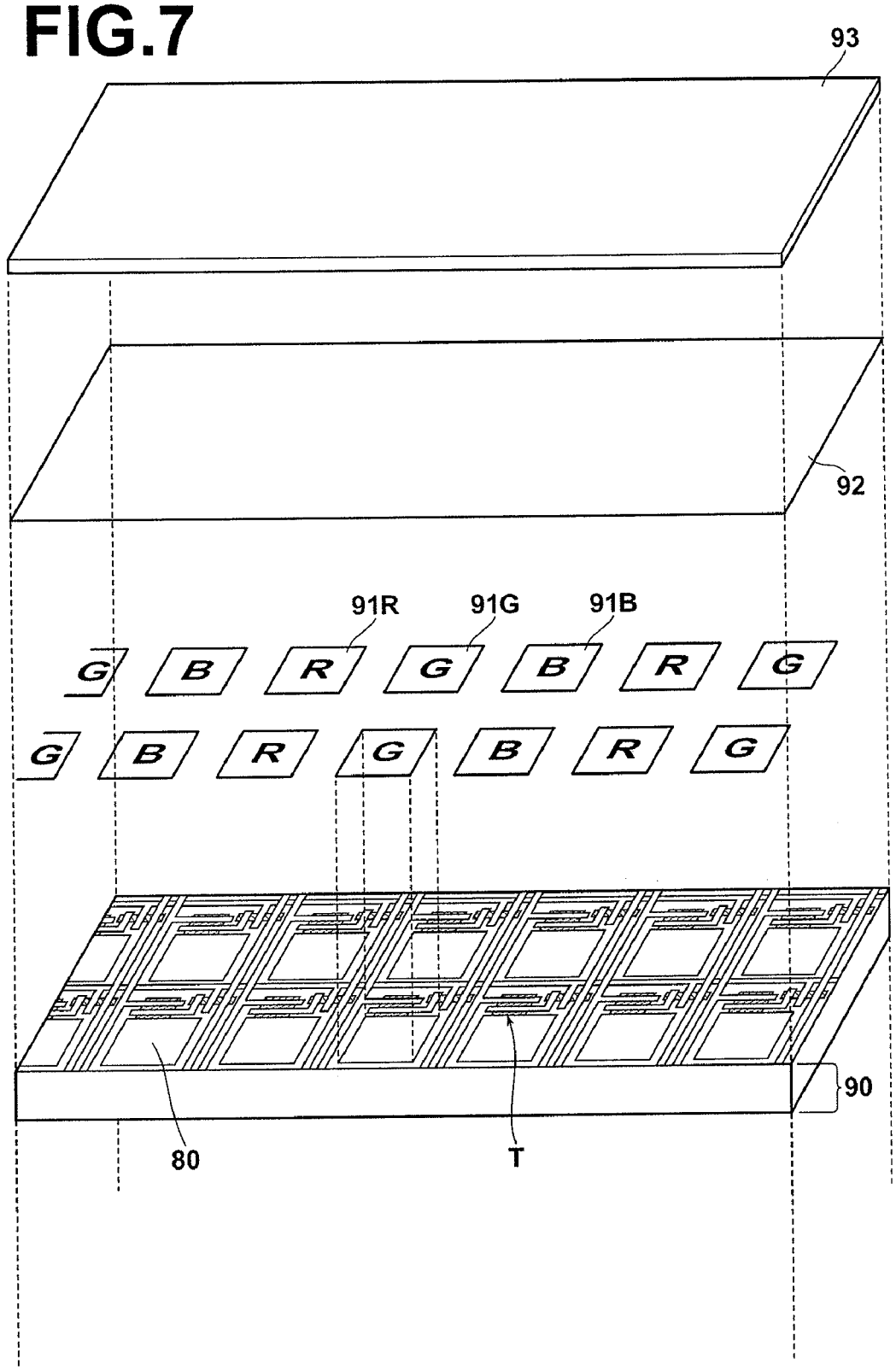

SEMICONDUCTOR DEVICE, METHOD FOR PRODUCING THE SAME, SENSOR AND ELECTRO-OPTICAL DEVICE

BACKGROUND OF THE INVENTION

1. Field of the Invention

The present invention relates to a semiconductor device, a method for producing the semiconductor device, a sensor and an electro-optical device. More particularly, the present invention relates to a semiconductor device and a method for producing the semiconductor device, which utilize resistance control of an inorganic oxide film through energy light exposure and oxidation treatment, as well as a sensor and an electro-optical device employing the semiconductor device.

2. Description of the Related Art

In recent years, various types of flexible devices are receiving attention. The flexible devices have various uses, such as electronic paper and flexible displays. The structure of a flexible device basically includes a crystalline semiconductor or a metal film patterned on a flexible substrate, such as a resin substrate. Since the flexible substrates have a lower heat resistance than that of inorganic substrates, such as glass substrates, it is necessary to carry out the entire production process of the flexible device at a temperature not higher than the operating temperature limit of the substrate. The operating temperature limit of a resin substrate, for example, is usually 150-200° C., although depending on the material. Even a material having a relatively high heat resistance, such as polyimide, has the operating temperature limit of at most about 300° C. Therefore, it is difficult to directly form a semiconductor device which necessitates a thermal process carried out at a relatively high temperature, such as a thin film transistor using silicon, on a resin substrate having low heat resistance.

To address this problem, semiconductor devices employing oxide semiconductors, which can be produced by low-temperature film formation, are being actively developed.

In the oxide semiconductors, the carrier is generated due to oxygen deficiency. Therefore, depending on the solid state properties of the formed thin film, the off current increases if the semiconductor device is directly formed, and it is not possible to obtain sufficient properties of the semiconductor device. In a case where a high resistance film with reduced carrier generation is used, the off current can be reduced. However, for the oxide semiconductors, a resistance reduction (high-density carrier generation) technique, such as doping (impurity implantation) used for Si semiconductors, has not been established. Therefore, it is difficult to produce a semiconductor device by reducing the resistance only at the source region and the drain region to reduce the contact resistance between these regions and electrodes.

In such a situation, Japanese Unexamined Patent Publication No. 2007-142196 has disclosed, as a prior example, a method for controlling carrier density, in which a thin film containing zinc oxide and tin oxide, which is formed by a physical film formation technique, such as sputtering, is subjected to heat treatment under the presence of oxygen at a temperature that provides a temperature at the film surface being not lower than a temperature of the substrate during the film formation.

The method disclosed in the above patent document can reduce the off current. However, this method makes the entire inorganic oxide film have highly resistance, and even the regions connecting to the source electrode and the drain electrode, i.e., the source region and the drain region have an increased resistance value. Therefore, it is impossible to provide good contact between these electrodes and these regions.

SUMMARY OF THE INVENTION

In view of the above-described circumstances, the present invention is directed to providing a semiconductor device having good device properties, which is provided by forming an inorganic oxide film having low resistance and making only a channel region thereof have high resistance, and a method for producing the semiconductor device. The present invention is also directed to providing a sensor and an electro-optical device employing the semiconductor device.

In order to achieve the above-described object, the present inventors focused on the fact that the sheet resistance value of an inorganic oxide film can be controlled by energy light exposure or oxidation treatment, thereby achieving the invention.

Namely, an aspect of the method for producing a semiconductor device according to the invention includes: forming a gate electrode on a substrate; forming a gate insulation film on the gate electrode; forming an inorganic oxide film on the gate insulation film, the inorganic oxide film being positioned above the gate electrode, the inorganic oxide film having a carrier density of $10^{19}/cm^3$ or more; forming a source electrode and a drain electrode connecting to the inorganic oxide film, the source electrode and the drain electrode partially covering the inorganic oxide film; and applying oxidation treatment to a region of the inorganic oxide film not covered by the source electrode and the drain electrode to reduce the carrier density of the region subjected to the oxidation treatment to $5\times10^{16}/cm^3$ or less.

The "inorganic oxide film" herein refers to a thin film containing a metal oxide as the main component. It should be noted that, containing a metal oxide "as the main component" herein means that the content of components of the inorganic oxide film other than the metal oxide is 10% or less in molar ratio.

Further, when the source electrode and the drain electrode are formed to partially "cover" the inorganic oxide film, the electrodes may be formed only on top of portions of the inorganic oxide film, or the electrodes may be formed to partially cover the inorganic oxide film and the sides of the inorganic oxide film. That is, it suffices that the source electrode and the drain electrode are formed on the inorganic oxide film, and the shape and coverage area of the source electrode and the drain electrode formed on inorganic oxide film do not matter. Moreover, whether the source electrode and the drain electrode are present on the sides of the inorganic oxide film has no effect on solving the problem by the invention.

In the method for producing a semiconductor device according to the invention, the inorganic oxide film may be formed from an inorganic oxide film precursor which is obtained by a liquid phase method using a material liquid containing an organic solvent and at least one material selected from the group consisting of an inorganic oxide particle, an organic precursor and an organic-inorganic composite precursor. The inorganic oxide film precursor may be converted into the inorganic oxide film by applying to the inorganic oxide film precursor a treatment, such as oxidation treatment, reduction treatment, ultraviolet light treatment, vacuum treatment, heat treatment, or a combination thereof. Optionally, ultraviolet laser light may be applied to the inorganic oxide film precursor to convert the inorganic oxide film precursor into the inorganic oxide film and reduce resistance of the inorganic oxide film.

The method for forming the inorganic oxide film precursor obtained by the liquid phase method may include coating using a liquid jet technique.

The inorganic oxide particle, the organic precursor and the organic-inorganic composite precursor respectively contain constituent elements of the inorganic oxide film. The "inorganic oxide particle" refers, for example, to a particle containing components of the inorganic oxide film. The inorganic oxide particle is a material that forms a part of the inorganic oxide film through oxidation treatment or heat treatment and can serve as a crystal nucleus for crystal growth.

The "organic precursor" refers, for example, to a compound, such as a metal alkoxide, containing an inorganic element forming the inorganic oxide film. By applying oxidation treatment or heat treatment to the organic precursor, the inorganic element becomes a part of the inorganic oxide film. On the other hand, by heating and stirring the organic precursor, a part of the organic precursor is particulated to form the inorganic oxide particle.

The "organic-inorganic composite precursor" refers to a particle which is formed in the course of particulation of the organic precursor, and contains an organic substance and an inorganic substance in an intermediate state of the particulation reaction.

The "inorganic oxide film precursor" refers to a film that is formed as a precursor of the inorganic oxide film, and is converted into the inorganic oxide film through a treatment, such as oxidation treatment, reduction treatment, ultraviolet light treatment, vacuum treatment, heat treatment, or a combination thereof.

The inorganic oxide film may contain at least one element selected from the group consisting of In, Zn, Ga and Sn.

The source electrode and the drain electrode may be formed by a liquid phase method using an inorganic particle dispersion liquid containing an organic solvent and an inorganic particle being surface-coated with a dispersant, which is bound to the inorganic particle via a chemical bond breakable by the oxidation treatment, and the oxidation treatment may reduce the carrier density of the inorganic oxide film and a specific resistance value of the source electrode and the drain electrode.

The "chemical bond breakable by the oxidation treatment" herein includes not only a chemical bond that is directly breakable by the oxidation treatment, but also a chemical bond that is breakable by interaction with another substance present around the inorganic particle caused by the oxidation treatment.

The method for forming the source electrode and the drain electrode using the liquid phase method may include coating using a liquid jet technique.

The inorganic particle may contain, as the main component, at least one inorganic substance selected from the group consisting of Au, Ag, Cu, Pt, Ni, Cr, Rh, Pd, Zn, Co, Mo, Ru, W, Os, Ir, Fe, Mg, Y, Ti, Ta, Nb, Mn, Ge, Sn, Ga, Al, In, and alloys and oxides thereof.

The oxidation treatment may apply, under the presence of oxygen, at least one treatment selected from the group consisting of oxygen radical treatment and heat treatment. The substrate may be a resin substrate.

The semiconductor device according to the invention is produced by the above-described method.

The sensor and the electro-optical device according to the invention are formed using the above semiconductor device.

BRIEF DESCRIPTION OF THE DRAWINGS

FIGS. 1A-1F are schematic sectional views illustrating steps of a method for producing a semiconductor device according to a first embodiment, FIGS. 2A-2G are schematic sectional views illustrating steps of a method for producing a semiconductor device according to a second embodiment, FIGS. 3A-3G are schematic sectional views illustrating steps of a method for producing a semiconductor device according to a third embodiment, FIG. 7 is a schematic perspective view of an electro-optical device according to the invention.

DESCRIPTION OF THE PREFERRED EMBODIMENTS

Figure 4:
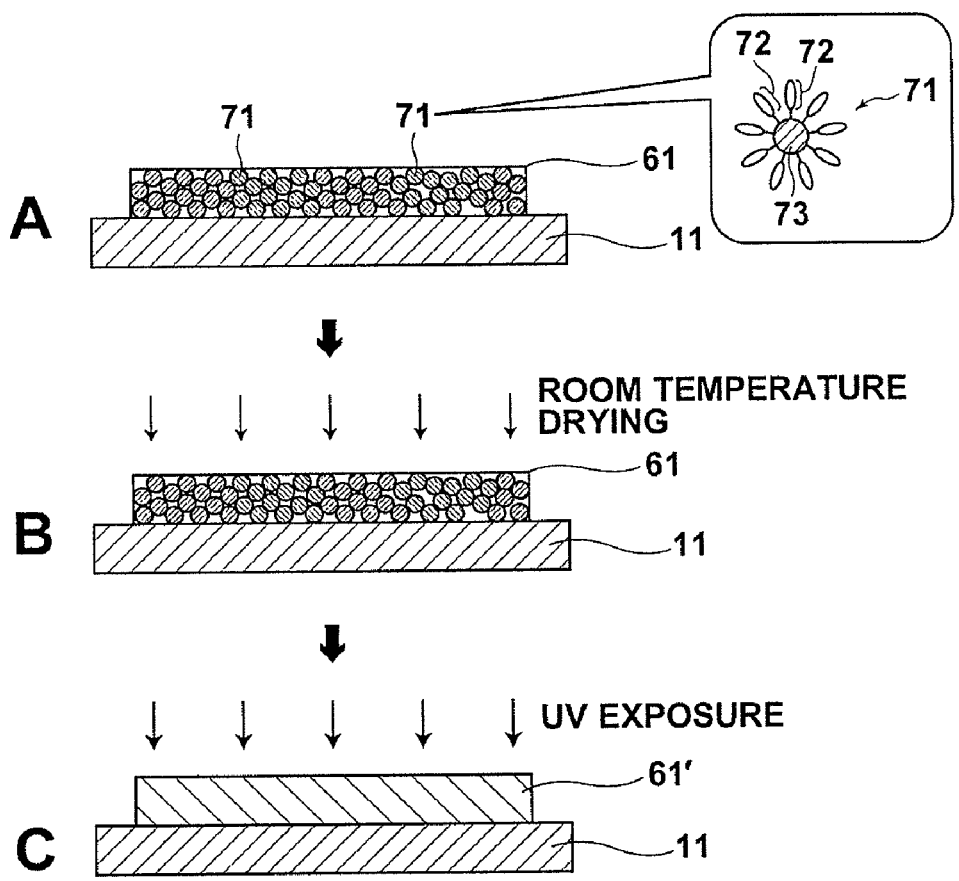
FIG. 4 is a schematic sectional view illustrating an example of film formation using a liquid phase method.

Hereinafter, embodiments of the present invention will be described by way of example with reference to the drawings, which are not intended to limit the invention.
Semiconductor Device and Production Method Thereof
First Embodiment FIGS. 1A-1F are schematic sectional views illustrating the production flow of a method for producing a semiconductor device according to a first embodiment. FIG. 1F illustrates the semiconductor device produced by the production method according to this embodiment.

As shown in the drawings, in the method for producing a semiconductor device according to this embodiment, a patterned gate electrode 20 is formed on a substrate 10 (FIG. 1A), a gate insulation film 30 is formed (FIG. 1B), and an inorganic oxide film 40' having a carrier density of $10^{19}/cm^3$ or more is formed through a dry process on the gate insulation film 30 so that the inorganic oxide film 40' is positioned above the gate electrode 20 (FIG. 1C). Thereafter, a source electrode 62 and a drain electrode 63 are formed through a dry process to partially cover the inorganic oxide film 40' (FIG. 1D), and oxidation treatment (in FIG. 1E, UV ozone treatment using ultraviolet light L2 is shown as an example) is applied to a channel region 44, which is not covered by the electrodes, of the inorganic oxide film 40' (FIG. 1E) to reduce the carrier density at the channel region 44 subjected to the oxidation treatment to $5 \times 10^{16}/cm^3$ or less.

The semiconductor device (FIG. 1F) produced according to this production method is a bottom gate thin film transistor (TFT).

The type of substrate 10 is not particularly limited, and may be any substrate, such as a glass substrate or a flexible substrate. However, in view of flexibility, durability, heat resistance, etc., a resin substrate, such as polyethylene terephthalate (PET), polyethylene naphthalate (PEN), polyimide (PI) or polyethersulfone (PES), may be used as the substrate 10. It should be noted that, if the substrate 10 is a resin substrate, a gas barrier layer, a heat barrier layer and/or a UV light blocking layer may be formed on the substrate 10.

The gate electrode 20 preferably has excellent conductivity, and may be formed, for example, of Al, Cu, Ag, Au, Pt or an alloy thereof. Alternatively, the gate electrode 20 may be formed of a conductive oxide film, such as ITO (indium tin oxide).

The gate insulation film 30 may be formed of a silicon oxide or a silicon nitride, such as $SiO_2$, $SiN_x$ or $SiO_xN_y$, or a metal oxide, such as $Al_2O_3$, $TiO_2$, $ZrO_2$ or $Y_2O_3$, in view of insulation and dielectric properties, and in particular, a silicon oxide or a silicon nitride may be used. The film thickness of the gate insulation film 30 may be selected as appropriate depending on various conditions, and may be in the range from about 50 to 500 nm.

The inorganic oxide film 40' may have a carrier density at the time of film formation of $10^{19}/cm^3$ or more, optionally $10^{20}/cm^3$ or more, and the carrier density is reduced to $5\times10^{16}/cm^3$ or less through the oxidation treatment. It should be noted that the carrier density is measured by measuring a hole effect that is induced when an external magnetic field is applied in a direction perpendicular to the direction of a current flowing in the film. If the inorganic oxide film 40' is formed of a material that provide a low carrier density at the time of film formation, the material may be one that allows adjustment of the carrier density to $10^{19}/cm^3$ or more, or optionally $10^{20}/cm^3$ or more, through a treatment, such as oxidation treatment, reduction treatment, ultraviolet light treatment, vacuum treatment, heat treatment, or any combination of these treatments. That is, the inorganic oxide film 40' may have a carrier density of $10^{19}/cm^3$ or more at the time of film formation, or may have a carrier density which is less than $10^{19}/cm^3$ at the time of film formation but can be adjusted to $10^{19}/cm^3$ or more by the above treatment. It should be noted that the former case is described as an example in this embodiment, and the latter case is described as an example in second and third embodiments, which will be described later.

The inorganic oxide film 40' may contain at least one element selected from the group consisting of In, Zn, Ga and Sn, and may be formed, for example, of $In_2O_3$, $Ga_2O_3$, ZnO or $InGaZnO_4$. The film thickness of the inorganic oxide film 40' may be selected as appropriate depending on various conditions, and may be in the range from about 20 to 500 nm. The crystal structure of the inorganic oxide film 40' is not limited in the semiconductor device and the method for producing the semiconductor device according to the invention. That is, the inorganic oxide film 40' may be amorphous or polycrystal. Further, the film formation method used for forming the inorganic oxide film 40'is not particularly limited, and a dry process, such as vapor deposition, sputtering or CVD, or a wet process (liquid phase method), such as a sol-gel method or a mist method, may be used, as appropriate. In particular, a liquid phase method may be used in view of ease of film formation and production costs. A case using a dry process is described in this embodiment, and a case using a liquid phase method is described in the second embodiment.

In this embodiment, if the inorganic oxide film 40' is formed by sputtering, for example, the inorganic oxide film 40' having low resistance and a carrier density of $10^{19}/cm^3$ or more at the time of film formation can be formed by setting a partial pressure ratio of oxygen in a film formation device to 0 during film formation.

The reason for limiting the carrier density of the inorganic oxide film 40' as "$10^{19}/cm^3$ or more, or optionally $10^{20}/cm^3$ or more" as described above is to obtain desired device properties of the semiconductor device for practical use, and more specifically, to ensure sufficiently high carrier density in the inorganic oxide film 40' to facilitate passage of the carrier through the potential barrier at the contact interface by the tunneling effect.

Similarly, the reason for limiting the carrier density after the oxidation treatment as "$5\times10^{16}/cm^3$ or less" as described above is to obtain the desired device properties. For example, in a case where the semiconductor device is used as a switching device, if the carrier density at the active region exceeds $5\times10^{16}/cm^3$, a current value in the off state is too high to provide good switching properties. In contrast, if the carrier density is $5\times10^{16}/cm^3$ or less, a sheet resistance value of 1 M$\Omega$/□ or more can be ensured even with a carrier mobility of 10 $cm^2$/V·s and a film thickness of 100 nm, for example, and a sufficient on/off ratio for a semiconductor device can be provided.

The source electrode 62 and the drain electrode 63 preferably have excellent conductivity, and may be formed, for example, of Al, Cu, Ag, Au, Pt, or an alloy thereof. Alternatively, the source electrode 62 and the drain electrode 63 may be formed of a conductive oxide film, such as ITO (indium tin oxide). Similarly to the inorganic oxide film 40', the source electrode 62 and the drain electrode 63 may be formed by a dry process or a wet process. In this embodiment, the source electrode 62 and the drain electrode 63 are formed by a dry process. It should be noted that, in the third embodiment, a case where a liquid phase method is used for forming the source electrode 62 and the drain electrode 63 is described.

The oxidation treatment is not particularly limited as long as it can oxidize the active layer portion of the inorganic oxide film 40', and may be at least one treatment selected from the group consisting of oxygen radical treatment and heat treatment, which is carried out under the presence of oxygen. In this case, the oxygen radical treatment may be UV ozone treatment or plasma treatment. As a light source of the ultraviolet light used in the UV ozone treatment, a low-pressure Hg lamp or a Xe excimer lamp may be used, for example. It suffices that the oxidation treatment is applied at least to a region which is used as the channel region.

The heat treatment may be carried out under the conditions of heating time ranging from 10 minutes to 6 hours and heating temperature ranging from 100 to 600° C. However, if the substrate is a resin substrate, the heating temperature within a temperature range not higher than the operating temperature limit of the resin substrate may be selected, as appropriate. For example, in a case of a ZnO film formed by coating an alkoxide solution and subsequently applying ultraviolet laser light, the sheet resistance value of the film can be increased from 1.20 k$\Omega$/□ to 1.03 G$\Omega$/□ by applying the heat treatment at 200° C. for 30 minutes in the atmosphere.

The UV ozone treatment may be carried out using a low-pressure Hg lamp ($\lambda$=185 nm, 254 nm) under the condition of about 3 minutes to 3 hours, and heat treatment (100-200° C.) may be used in combination. In particular, it is more effective to simultaneously carry out the UV ozone treatment and the heat treatment. For example, effective oxidation treatment can be achieved by carrying out the UV ozone treatment for 90 minutes using the low-pressure Hg lamp, and simultaneously carrying out the heat treatment at 150° C. for 60 minutes. In this case, it suffices that the 60 minutes of heat treatment maintained at 150° C. is included in the 90 minutes of UV ozone treatment.

The plasma treatment may be carried out using $O_2$ plasma under the conditions of about 50-300 Pa, 100-1000 W, and 30 seconds to 2 hours. Similarly to the UV ozone treatment, heat treatment (100-200° C.) may be used in combination. In particular, it is more effective to simultaneously carry out the plasma treatment and the heat treatment. For example, effective oxidation treatment can be achieved by simultaneously carrying out the plasma treatment using O2 plasma under the conditions of 100 Pa, 500 W, and 20 minutes and the heat treatment under the conditions of 150° C. and 30 minutes. Similarly to the above-described case, it suffices that the 20 minutes of plasma treatment is included in the 30 minutes of heat treatment maintained at 150° C.

It should be noted that, when the above-described oxidation treatment is carried out, the treatment conditions, the electrode material, the film thickness, etc., may be selected as appropriate so that the source electrode 62 and the drain electrode 63 do not have high resistance through the oxidation. Further, it is not necessary to apply the oxidation treatment to the entire inorganic oxide film 40'. It suffices that the oxidation treatment is applied at least to the portion, which is used as the active layer, of the inorganic oxide film 40' to increase the specific resistance value at the portion.

Operation of this embodiment is described below.

In the method for producing a semiconductor device of this embodiment, the source electrode 62 and the drain electrode 63 are formed to partially cover the inorganic oxide film 40', and the oxidation treatment is applied at least to the region of the inorganic oxide film 40' to be used as the channel region 44 of the semiconductor device, which is not covered by the electrodes, to reduce the carrier density only at the region and provide high resistance at the region. The principle of this resistance increase is that the oxygen deficiency generated in the inorganic oxide film 40' is filled by the oxidation. Thus, the carrier electrons disappear and the movable carrier density in the inorganic oxide film 40' decreases.

On the other hand, the source region 42 and the drain region 43 are not oxidized due to the presence of the source electrode 62 and the drain electrode 63, and are maintained in the low resistance state.

As a result, good contact can be provided at the connection points between the source electrode 62 and the source region 42, and between the drain electrode 63 and the drain region 43, thereby improving the properties of a semiconductor device employing the inorganic oxide film 40'. This allows selection of the electrode material with giving priority to resistance value, workability, reliability and costs, for example.

Second Embodiment

FIGS. 2A-2G are schematic sectional views illustrating the production flow of a method for producing a semiconductor device according to a second embodiment. FIG. 2G illustrates the semiconductor device produced by the production method according to this embodiment.

The method for producing a semiconductor device of this embodiment differs from the method of first embodiment in that, in the second embodiment, the inorganic oxide film 40' is formed by a liquid phase method. The other features are the same as the first embodiment, and therefore, description of the same features as the first embodiment shown in FIG. 1 is omitted unless it is necessary.

As shown in the drawing, in the method for producing a semiconductor device according to this embodiment, the patterned gate electrode 20 is formed on the substrate 10 (FIG. 2A), the gate insulation film 30 is formed (FIG. 2B), an inorganic oxide film precursor 40 is formed through a liquid phase method on the gate insulation film 30 so that the inorganic oxide film precursor 40 is positioned above the gate electrode 20 (FIG. 2C), and heat treatment and/or oxidation treatment is applied to convert the inorganic oxide film precursor 40 into the inorganic oxide film 40' and reduce the resistance of the film to form the inorganic oxide film 40' having the carrier density of $10^{19}/cm^3$ or more (FIGS. 2C and 2D). Thereafter, the source electrode 62 and the drain electrode 63 are formed through the dry process to partially cover the inorganic oxide film 40' (FIG. 2E), and the oxidation treatment (in FIG. 2F, the UV ozone treatment using the ultraviolet light L2 is shown as an example) is applied the channel region 44, which is not covered by the electrodes, of the inorganic oxide film 40' (FIG. 2F) to reduce the carrier density at the channel region 44 subjected to the oxidation treatment to $5\times10^{16}/cm^3$ or less.

The semiconductor device (FIG. 2G) produced according to this production method is a bottom gate thin film transistor (TFT).

The method for forming the inorganic oxide film 40' using the liquid phase method may, for example, be a method including steps (A) to (C) described below. Use of this method allows formation of the inorganic oxide film 40' having good crystallinity by a low temperature process carried out at a temperature not higher than the operating temperature limit of the substrate, even when a resin substrate is used.

(Step (A))

On the surface of a substrate, on which an inorganic oxide coated film (which refers to the inorganic oxide film formed by the liquid phase method, and the same applies to the following description) is to be formed, a material liquid containing an organic solvent and a material, which contains elements forming the inorganic oxide coated film (hereinafter referred to as constituent elements of the inorganic oxide coated film), is coated to form an inorganic oxide coated film precursor (which refers to the inorganic oxide film precursor formed by the liquid phase method, and the same applies to the following description).

In step (A), the material liquid contains the organic solvent and at least one material selected from the group consisting of an inorganic oxide particle, an organic precursor and an organic-inorganic composite precursor. The inorganic oxide particle, the organic precursor and the organic-inorganic composite precursor respectively contain the constituent elements of the inorganic oxide coated film.

In this case, the material liquid may contain the organic precursor and the organic solvent. The organic precursor may, for example, be a metal alkoxide compound containing the constituent elements of the inorganic oxide coated film, which is used as a starting material in the sol-gel method.

Alternatively, the material liquid may contain the inorganic oxide particle and/or the organic-inorganic composite precursor and the organic solvent. This material liquid may be a dispersion liquid of the inorganic oxide particle and/or the organic-inorganic composite precursor, which is obtained by preparing a solution containing the organic precursor and the organic solvent and particulating the organic precursor. The method used for particulating the organic precursor in the solution is not particularly limited, and, for example, heating and stirring may be used. In the case where the inorganic oxide coated film precursor is formed by the liquid phase method (nanoparticulation method) using the material liquid, the amount of an organic substance(s) contained in the inorganic oxide coated film precursor decreases due to the particulation before film formation, and the inorganic oxide particle serves as a crystal nucleus for crystal growth in the later step (C) to facilitate the crystallization. It should be noted that, in this case, some portion of the organic precursor, which has not been particulated, may remain in the inorganic oxide coated film precursor.

The method used for coating the material liquid is not limited, and examples thereof include various coating methods, such as spin coating and dip coating, and printing techniques, such as inkjet printing and screen printing. Using the printing technique such as inkjet printing or screen printing, a desired pattern can directly be formed. In particular, the material liquid may be coated using a liquid jet technique, such as inkjet printing, and this can be achieved by using, for example, a liquid jet device which uses an inkjet head.

The substrate may be a resin substrate. In this method, the inorganic oxide coated film having low resistance can be produced by a relatively low-temperature process which is carried out at a temperature not higher than the operating temperature limit of the resin substrate. Therefore, this method is applicable to a resin substrate having an operating temperature limit of 200° C. or less, or even 150° C or less. For TFTs used for flexible displays, resin substrates, such as polyethylene terephthalate (PET), polyethylene naphthalate (PEN) and polyimide (PI) have preferably been used. In addition, inexpensive PET and PEN having an operating temperature limit of 200° C. or less may be used. Other examples of usable resin substrates may include polycarbonate (PC), polyarylate (PAR), aromatic polyether ketone (PEEK), aromatic polyether sulfone (PES), wholly aromatic polyketone, cyclic olefin polymer and liquid crystal polymer.

(Step (B))

Heat treatment and/or oxidation treatment is applied to the inorganic oxide coated film precursor to decompose organic components contained in the inorganic oxide coated film precursor.

This step (B) is a pretreatment before step (C) of sintering and satisfactorily densifying the inorganic oxide coated film precursor into the inorganic oxide coated film and reducing the resistance of the film.

The heat treatment is carried out at a temperature not higher than the operating temperature limit of the substrate, such as not higher than 200° C., or optionally not higher than 100-150° C.

The oxidation treatment is not particularly limited, and may, for example, be oxygen radical treatment. Examples of the oxygen radical treatment include a treatment to apply ultraviolet light having a wavelength of 350 nm or less under the presence of oxygen or ozone or a treatment to apply oxygen plasma. The ultraviolet light having the wavelength of 350 nm or less may be ultraviolet light emitted from a light source such as a mercury lamp or an excimer lamp. The oxidation treatment method may be the oxygen radical treatment, which provides efficient decomposition of the organic components and which does not necessitates high-temperature heating. By applying this pretreatment, the organic substance(s) remaining in the inorganic oxide coated film precursor disappears before the crystallization step, thereby minimizing ablation, etc., due to the remaining organic substance and allowing good crystal growth in the subsequent step (C).

It should be noted that the oxidation treatment may also be achieved by heat treatment under the presence of oxygen. The heat treatment serving as the oxidation treatment may be carried out using a heater, or the like, or may be carried out using a heating mechanism formed by the light source used in the oxygen radical treatment, such as a mercury lamp or an excimer lamp. In this case, the oxygen radical treatment and the heat treatment can simultaneously be carried out by application of the ultraviolet light from the light source.

(Step (C))

The thus pretreated inorganic oxide coated film precursor is sintered to obtain the inorganic oxide coated film.

The sintering is achieved by heating the inorganic oxide coated film precursor at a temperature not higher than the operating temperature limit of the substrate. The method used for the sintering is not limited, however, may be a heat treatment using a heat ray. An example of the heat treatment using the heat ray may be laser annealing, which uses a laser beam as the heat ray to anneal and densify the inorganic oxide coated film with the laser beam being moved to scan the inorganic oxide coated film.

Since the laser annealing is a scanning-type heat treatment using a high-energy heat ray, it provides efficient sintering. Further, the amount of energy reaching the substrate can be controlled by changing the laser exposure conditions, such as the scanning speed and the laser power. By determining the laser exposure conditions depending on the heat resistance of the substrate, the substrate temperature of not higher than the operating temperature limit of the substrate can be provided. Therefore, this method is advantageous when a resin substrate having low heat resistance is used.

A laser light source used for the laser annealing is not particularly limited, however, may be a pulsed laser, such as an excimer laser. In this case, a short-wavelength pulsed laser, such as an excimer laser, may be used, since the amount of energy absorbed at the film surface layer is large and the energy reaching the substrate can easily be controlled. For similar reasons, when the pulsed laser is used, the pulsed laser may have a short pulse width of 100 ns or less, or optionally several ten nanoseconds or less.

In practice, under the conditions where a KrF excimer laser (160 mJ/cm$^2$) is applied to a coated film having a film thickness of about 100 nm, for example, the carrier density of an InGaZnO$_4$ coated film increases to about $10^{19}$-$10^{20}$/cm$^3$, and the carrier density of a ZnO coated film increases to about $10^{21}$/cm$^3$. Of course, a desired carrier density value can be obtained by using an appropriate treatment method and treatment conditions. In this manner, the contact resistance at the contact portions between the source region 42 and the drain region 43 and between the source electrode 62 and the drain electrode 63 can be reduced.

The principle of the above-described resistance reduction achieved by the application of the ultraviolet laser light L1 is that the oxygen deficiency is generated in the inorganic oxide film 40' by applying the short wavelength light to the inorganic oxide film 40'. Thus, the carrier electrons are generated and the movable carrier density in the inorganic oxide film 40' increases. This effect is equivalent to increasing the carrier electrons by doping an n-dopant to a Si semiconductor film.

The ultraviolet laser light L1 may be laser light having a wavelength within a band of about 150 nm to 350 nm. In this case, a short-wavelength pulsed laser may be used, since the amount of energy absorbed at the film surface layer is large and the energy reaching the substrate can easily be controlled. For similar reasons, when the pulsed laser is used, the pulsed laser may have a short pulse width of 100 ns or less, or optionally several ten nanoseconds or less. Examples of the ultraviolet laser light L1 may include a XeCl excimer laser ($\lambda$=308 nm), a KrF excimer laser ($\lambda$=248 nm) and an ArF excimer laser ($\lambda$=193 nm).

Operation of this embodiment is described below.

In the method for producing a semiconductor device of this embodiment, similarly to the previous embodiment, the source electrode 62 and the drain electrode 63 are formed to partially cover the inorganic oxide film 40', and the oxidation treatment is applied at least to the region of the inorganic oxide film 40' to be used as the channel region 44 of the semiconductor device, which is not covered by the electrodes, to reduce the carrier density only at the region and provide high resistance at the region. On the other hand, the source region 42 and the drain region 43 are not oxidized due to the presence of the source electrode 62 and the drain electrode 63, and are maintained in the low resistance state.

In practice, when the above-described ZnO coated film having the resistance reduced by the laser exposure is heated at a temperature of 200° C. for 30 minutes, the carrier density of the film decreases to $10^{15}$/cm$^3$. When the ZnO coated film is subjected to UV exposure (UV source: low-pressure mercury lamp ($\lambda$=254 nm), power: 9 mW/cm$^2$, spacing: 6 mm) for 90 minutes, the carrier density of the film decreases to $10^{14}$/cm$^3$. Similarly, when the above-described InGaZnO$_4$ coated film having the resistance reduced by the laser exposure is heated at a temperature of 400° C. for 30 minutes, the carrier density of the film decreases to $10^{15}/cm^3$. Of course, a desired carrier density value can be obtained by using an appropriate treatment method and treatment conditions.

Thus, the same effect as that of the first embodiment can be obtained.

Further, since the inorganic oxide film 40' is formed by the liquid phase method, effects, such as no need of a vacuum system in formation of the inorganic oxide film 40', capability of forming large area devices and cost reduction, can be obtained.

Third Embodiment

FIGS. 3A-3G are schematic sectional views illustrating the production flow of a method for producing a semiconductor device according to a third embodiment. FIG. 3G illustrates the semiconductor device produced by the production method according to this embodiment.

The method for producing a semiconductor device of this embodiment differs from the method of the second embodiment in that the source electrode 62 and the drain electrode 63 are formed using a liquid phase method, in stead of the dry process. The other features are the same as the second embodiment, and therefore, description of the same features as the second embodiment shown in FIGS. 2A-2G is omitted unless it is necessary.

As shown in the drawing, in the method for producing a semiconductor device according to this embodiment, the patterned gate electrode 20 is formed on the substrate 10 (FIG. 3A), the gate insulation film 30 is formed (FIG. 3B), the inorganic oxide film precursor 40 is formed through the liquid phase method on the gate insulation film 30 so that the inorganic oxide film precursor 40 is positioned above the gate electrode 20 (FIG. 3C), and the ultraviolet laser light L1 is applied to increase the carrier density in the film to $10^{19}/cm^3$ or more to form the inorganic oxide film 40' (FIG. 3D). Thereafter, the source electrode 62 and the drain electrode 63 are formed through a liquid phase method to partially cover the inorganic oxide film 40' (FIG. 3E), and the oxidation treatment (the UV ozone treatment using the ultraviolet light L2) is applied simultaneously to the source electrode 62 and the drain electrode 63 and the channel region 44 of the inorganic oxide film 40', which is not covered by these electrodes (FIG. 3F), to reduce the carrier density at the channel region 44 subjected to the oxidation treatment to $5 \times 10^{16}/cm^3$ or less, and to reduce the resistance at the source electrode 62 and the drain electrode 63 to provide a source electrode 62' and a drain electrode 63'.

Similarly to the first embodiment, the semiconductor device produced according to this production method (FIG. 3G) is a bottom gate TFT.

The method for forming the source electrode 62' and the drain electrode 63' may, for example, be a liquid phase method including steps (D) and (E) described below. Use of this method allows formation of the source electrode 62' and the drain electrode 63' having good crystallinity by a low temperature process carried out at a temperature not higher than the operating temperature limit of the substrate, even when a resin substrate is used.

(Step (D))

First, as shown at "A" in FIG. 4, a substrate 11 is prepared. Then, a material liquid containing a dispersed particle 71 and an organic solvent is coated on the surface of the substrate 11. The dispersed particle 71 is formed of an inorganic particle 73, which contains constituent elements (hereinafter referred to as constituent elements of the inorganic film) of an inorganic substance forming a conductive inorganic film 61' (which is equivalent to the source electrode 62' and the drain electrode 63' shown in FIGS. 3F and 3G) and is surface-coated with a dispersant 72, which is bound by a chemical bond breakable by oxidation treatment. Thus, a conductive inorganic film precursor 61 containing the inorganic particle 73 is formed by the liquid phase method.

The substrate 11 and the method used for coating the material liquid are the same as those used in the above-described method for forming the inorganic oxide film 40' using the liquid phase method.

In step (D), the material liquid contains the organic solvent and the dispersed particle 71 formed by the inorganic particle 73 containing the constituent elements of the inorganic film, and the inorganic particle 73 is surface-coated with the dispersant 72, which is bound by a chemical bond breakable by oxidation treatment, as described above. The material liquid may contain an organic binder, such as resin, as necessary.

The inorganic particle 73 is not particularly limited, however, may be a metal particle or a metal oxide particle. The inorganic particle 73 may contain, as the main component, at least one inorganic substance selected from the group consisting of Au, Ag, Cu, Pt, Ni, Cr, Rh, Pd, Zn, Co, Mo, Ru, W, Os, Ir, Fe, Mg, Y, Ti, Ta, Nb, Mn, Ge, Sn, Ga, Al, In, and alloys and oxides thereof.

The mean particle diameter of the inorganic particle 73 is not particularly limited, however, may be 100 nm or less to allow use of low-temperature sintering. If the particle size of the inorganic particle, such as a metal particle, is several nanometers, the melting point of the inorganic particle is lowered and the inorganic particle melts at a temperature which is significantly lower than the bulk melting point of the substance. Therefore, particles of the inorganic particle fuse to each other at a relatively low temperature to exhibit conductivity. Further, in a case where the material liquid is coated using an inkjet technique, the inorganic particle 73 needs to have a particle diameter smaller than the nozzle diameter, so that the nozzle used to eject the material liquid is not clogged. It should be noted that the mean particle diameter of the inorganic particle is measured using a dynamic light scattering method, such as the photon correlation method. Examples of a device used for measuring the particles size using the dynamic light scattering method may include a dynamic light scattering photometer DLS-7000 SERIES, available from Otsuka Electronics Co., Ltd., a concentrated-system particle diameter analyzer FPAR-1000, available from Otsuka Electronics Co., Ltd., and a dynamic light scattering nanotrack particle size distribution measuring device UPA-EX150, available from Nikkiso Co., Ltd.

The dispersant 72 is not particularly limited as long as it can be bound to the surface of the inorganic particle 73 by a chemical bond which is breakable by oxidation treatment in the subsequent step (E), and may preferably have good dispersion stability.

The chemical bond which is breakable by oxidation treatment may, for example, be a coordinate bond. Therefore, the dispersant 72 may have a group that can form a coordinate bond with the constituent elements of the inorganic particle 73. Examples of the group that can form a coordinate bond with the constituent elements of the inorganic particle 73 may include an amino group, a sulfanyl group, a hydroxy group and an ether group. The dispersant 72 may be dissociated by a reaction with the organic solvent contained in the material liquid during the oxidation treatment. Examples of the dispersant 72 may include amines, alcohols, thiols and ethers. More specifically, by using alkane thiol or alkyl amine, for example, the coating of the inorganic particle 73 via the above-described chemical bond can be achieved.

The organic solvent in the material liquid is not particularly limited as long as it allows dispersion of the inorganic particle 73 coated with the dispersant 72, however, may be an organic solvent that can easily decompose in the subsequent step (E). Further, an organic solvent which helps the dissociation reaction of the dispersant 72 from the inorganic particle 73 in step (E), such as an organic acid anhydride, an acid anhydride derivative, or an organic acid (such as a straight-chain saturated calboxylic acid) may be contained.

It should be noted that, in this step, most of the organic solvent in the conductive inorganic film precursor 61 may be removed by room-temperature drying, or the like, as shown at "B" in FIG. 4. At this time, the amount of the organic solvent to be removed may be an amount that allows effective oxidation treatment and good crystal growth in the subsequent step (E). Since the organic solvent begins natural evaporation immediately after being coated, the room temperature drying step may be omitted. However, if the organic solvent contains an organic component that is hard to naturally evaporate, the drying step effectively promotes evaporation of the organic solvent. In this step, some heating may be carried out within a range where the dispersant 72 does not dissociate from the surface of the inorganic particle 73.

(Step (E))

Subsequently, the oxidation treatment is applied to the conductive inorganic film precursor 61 under the temperature condition of higher than 100° C. and not higher than the operating temperature limit of the substrate 11 ("C" in FIG. 4). Further, the temperature at this time may not be higher than a thermal decomposition onset temperature of an organic component having the highest thermal decomposition onset temperature among the organic components contained in the conductive inorganic film precursor 61.

Instep (E), this oxidation treatment breaks the chemical bond between the inorganic particle 73 and the dispersant 72 contained in the conductive inorganic film precursor 61, and the dispersant 72 dissociates from the surface of the inorganic particle 73 and the organic components contained in the conductive inorganic film precursor 61 decompose. Further, particles of the inorganic particle 73, from which the dispersant 72 has been dissociated, fuse to each other to provide the conductive inorganic film 61'.

The method used to apply the oxidation treatment to the conductive inorganic film precursor 61 is not limited, however, may be oxidation treatment using oxygen radical, for example. Examples of the oxidation treatment using oxygen radical may include a treatment to apply ultraviolet light having a wavelength of 400 nm or less under the presence of oxygen or ozone, or a treatment to apply oxygen plasma. The ultraviolet light may optionally have a wavelength of 300 nm or less. Examples of the ultraviolet light having a wavelength of 400 nm or less may include ultraviolet light emitted from a light source such as a mercury lamp or an excimer lamp. The method using oxygen radical is advantageous in that it provides efficient decomposition of the organic components and it does not necessitate high temperature heating. By applying this oxidation treatment, good dissociation of the dispersant 72 bound to the surface of the inorganic particle 73 and decomposition of the organic components contained in the conductive inorganic film precursor 61 are achieved.

In step (E), the oxidation treatment is carried out under the temperature condition of higher than 100° C. and not higher than the operating temperature limit of the substrate 11. Further, the temperature at this time may not be higher than a thermal decomposition onset temperature of an organic component having the highest thermal decomposition onset temperature among the organic components contained in the conductive inorganic film precursor 61. The oxidation treatment carried out under the above-described conditions can more efficiently promote dissociation and decomposition of the dispersant 72 than oxidation treatment which is carried out without heating.

Figure 5:
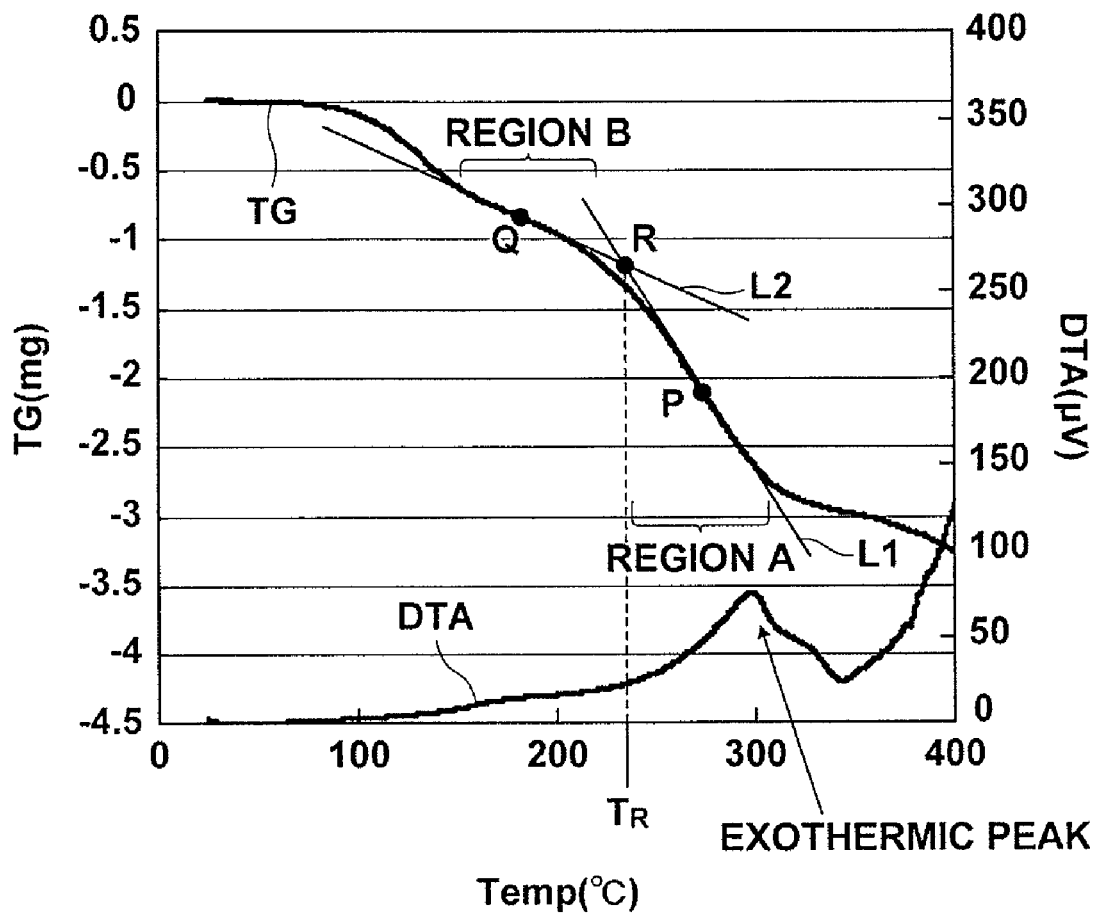
FIG. 5 shows a result of TG/DTA measurement of an Ag paste.

In a case where the conductive inorganic film precursor 61 contains several organic components, such as a commercially available Ag nanopaste, the "thermal decomposition onset temperature of an organic component having the highest thermal decomposition onset temperature among the organic components contained in the conductive inorganic film precursor 61" can be found by thermal analysis achieved by TG/DTA (Thermo Gravimetry Differential Thermal Analyzer) measurement under the temperature condition where the temperature is raised at a fixed rate. FIG. 5 shows a result of the TG/DTA measurement of the Ag nanopaste (Ag1TeH) (rate of temperature increase: 10° C./minute), for example. In FIG. 5, the "thermal decomposition onset temperature of an organic component having the highest thermal decomposition onset temperature among the organic components contained in the conductive inorganic film precursor 61" is a temperature TR (about 230° C. in FIG. 5), which is at the intersection R between the tangent line L1 tangential to the inflection point P of the TG curve in the region A just before the exothermic peak of the DTA curve in FIG. 5, and the tangent line L2 tangential to the inflection point Q, which is the nearest inflection point to the inflection point P among inflection points of the TG curve in the region B which is a lower temperature region than the region A. In the case of Ag1TeH, the organic component having the highest thermal decomposition onset temperature is the dispersant 72. If the amount of the organic solvent contained in the conductive inorganic film precursor 61 is large, as in the Ag nanopaste used in the measurement shown in FIG. 5, the amount of the solvent may be reduced by being dried before the TG/DTA measurement. In the measurement shown in FIG. 5, the ink had been dried at 130° C. for 20 minutes before the TG/DTA measurement.

The temperature condition for the oxidation treatment is not particularly limited as long as the temperature is within the above-described range, however, the temperature condition may be determined to allow good fusion of the particles of the inorganic particle 73, from which the dispersant 72 has been removed, by the dissociation of the dispersant 72 and the decomposition of the organic components. The temperature that allows fusion of the inorganic particle 73 varies depending on the constituent elements and the particle diameter of the inorganic particle. However, if the mean particle diameter of the inorganic particle 73 is on the nanometer order (100 nm or less), a temperature higher than 100° C. allows good fusion of the inorganic particle 73 regardless of the constituent elements of the inorganic particle. In general, a smaller particle diameter of the inorganic particle 73 can provide the conductive inorganic film 61' having low resistance at a relatively low temperature. In order to apply the oxidation treatment to the inorganic particle 73 having a larger particle diameter or to achieve better conductivity, the temperature condition for the oxidation treatment may be not lower than 120° C., or optionally not lower than 140° C. At a stage where the inorganic particle 73 begins to fuse, the dispersant 72 has satisfactorily been dissociated and decomposed, and the amount of the remaining organic substance is sufficiently low. Thus, the conductive inorganic film 61' having low resistance can be provided.

The heating may be achieved using a heater, or the like. However, in a case where the light source, such as a mercury lamp or an excimer lamp, used for the oxidation treatment is provided with a heating mechanism, application of the ultraviolet light from the light source can simultaneously achieve the oxidation treatment and the heat treatment.

The time and the temperature for the oxidation treatment and the heat treatment may be designed as appropriate depending on the type of the substrate and the type of the material liquid (the type of the dispersant 72, the particle diameter of the inorganic particle 73, concentration, etc.) For example, in a case where the material liquid is a metal nanopaste, in which the dispersant 72 dissociates from the surface of the dispersed particle 71 at a temperature around 220° C., the mean particle diameter of the metal particle (inorganic particle 73) is around 3-7 μm, and the oxidation treatment is carried out using a UV ozone cleaner, the conditions of temperature higher than 100° C. and not higher than 150° C. and heating time of about 60 minutes to 150 minutes can provide the conductive inorganic film 61' having low resistance of 0.2 to several $\Omega/\square$, although depending on the ozone concentration and the active oxygen concentration during the oxidation treatment. In general, a smaller particle diameter of the inorganic particle 73 can provide the conductive inorganic film 61' having low resistance at a relatively low temperature.

Operation of this embodiment is described below.

The structure of the semiconductor device according to this embodiment is the same as the structure of the semiconductor device according to the first embodiment described above. Namely, the source electrode 62 and the drain electrode 63 are formed to partially cover the inorganic oxide film 40', and the oxidation treatment is applied at least to the region of the inorganic oxide film 40' to be used as the channel region 44 of the semiconductor device, which is not covered by the electrodes, to reduce the carrier density only at the region and provide high resistance at the region. On the other hand, the source region 42 and the drain region 43 are not oxidized due to the presence of the source electrode 62 and the drain electrode 63, and are maintained in the low resistance state.

Thus, the same effect as that of the first embodiment can be obtained.

Further, in this embodiment, the source electrode 62' and the drain electrode 63' are formed by the liquid phase method as described above. This allows simultaneously achieving the provision of the channel region 44 having high resistance and the source electrode 62' and the drain electrode 63' having low resistance, and thus the semiconductor device production process can consistently be carried out using low temperature processes. This facilitates use of a flexible substrate, such as a resin substrate, as the substrate 10 of the semiconductor device, and therefore is advantageous for production of flexible devices.

In practice, for example, in a case of the conductive inorganic film precursor 61 having a film thickness of 580 nm, which is formed by coating a commercially available silver paste on a PET film substrate by a liquid jet technique using an inkjet device, and then drying the coating at the room temperature for 180 minutes (example 1), the sheet resistance value can be reduced from $10^8$ $\Omega/\square$ to 1.33 $\Omega/\square$ by applying the oxidation treatment for 60 minutes using a UV ozone cleaner provided with a heating mechanism. Thus, the good conductive inorganic film 61' can be obtained. It should be noted that, at this time, a temperature in the vicinity of the film surface of the film dried at the room temperature is controlled to gradually increase from the room temperature to 140-150° C. through the exposure by the UV ozone cleaner. The commercially available silver paste used in this example is Ag nanopaste NPS-J (having a metal content of 58.6 wt %, a mean particle diameter of 3-7 nm, a viscosity of 9.2 mPa·s), available from Harima Chemicals, Inc.

In a case where the conductive inorganic film precursor 61 is formed in the same manner as in example 1 on a quartz glass substrate (example 2), the sheet resistance value can be reduced from $10^8$ $\Omega/\square$ to 0.33 $\Omega/\square$ by applying the oxidation treatment for 90 minutes using a UV ozone cleaner provided with a heating mechanism.

In a case where the conductive inorganic film precursor 61 is formed in the same manner as in example 2 with replacing the silver paste available from Harima Chemicals, Inc. with a silver paste (Ag nanometal ink Ag1TeH (having a metal content of 58 wt %, a mean particle diameter of 3-7 nm, a viscosity of 13 mPa·s)) available from ULVAC Materials, Inc. (example 3), the sheet resistance value can be reduced from $10^8$ $\Omega/\square$ to 2.28 $\Omega/\square$ by applying the same treatment as that in example 2. Further, in a case where the coated film obtained in example 3 is subsequently subjected to sintering using laser annealing by applying light emitted from a KrF excimer laser (wavelength: 248 nm, number of exposure: 20 shots, exposure power: 50 mJ/cm$^2$), the sheet resistance value can further be reduced to 1.2 $\Omega/\square$.

The specific resistance can be calculated, for example, from a sheet resistance Rs of an object to be measured and a film thickness t measured by SEM, according to the formula:

Specific resistance ρ=Rs·t.

In an actual semiconductor device production process, the step (E) of applying the oxidation treatment may be combined with the step of oxidation treatment shown in FIG. 3F. That is, by the step of the oxidation treatment shown in FIG. 3F, the treatment to provide the channel portion 44 having high resistance and the treatment to provide the source electrode 62 and the drain electrode 63 having low resistance can simultaneously be achieved (FIG. 3F). This allows improvement of production efficiency of the semiconductor device and reduction of production costs.

Sensor

Figure 6:
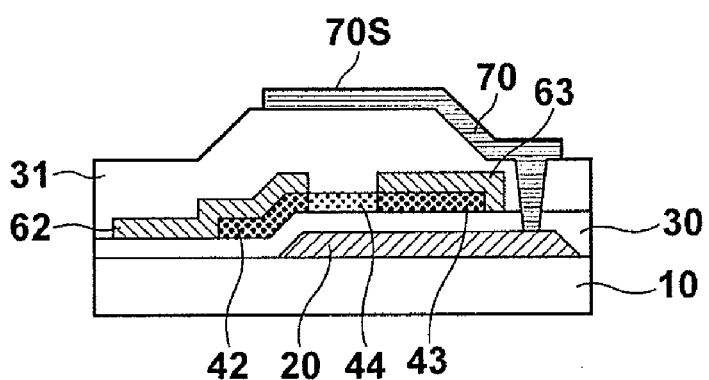
FIG. 6 is a schematic sectional view of a sensor according to the invention.

FIG. 6 is a sectional view of a sensor according to one embodiment of the invention.

As shown in the drawing, the sensor includes, on the semiconductor device according to the first embodiment, an interlayer insulation film 31 and a sensing section 70 formed to contact the gate electrode 20 via a contact hole formed in the interlayer insulation film 31.

The sensing section 70 may be formed of a metal material, such as Au, Ag or Pt, and the surface (sensing surface 70s) of the sensing section 70 maybe surface-modified to be able to bind with a substance to be detected. The surface modification is selected according to the use of the sensor. If the sensor is used as a protein sensor, for example, the sensing surface may be modified with an acceptor, such as an antibody. If the sensor is used as a DNA chip, the sensing surface may be modified with a probe DNA, for example.

Similarly to the gate insulation film 30, the interlayer insulation film 31 may be formed, for example, of a silicon oxide or a silicon nitride, such as SiO$_2$, SiN$_x$ or SiO$_x$N$_y$, or a metal oxide, such as Al$_2$O$_3$, TiO$_2$, ZrO$_2$ or Y$_2$O$_3$, in view of insulation and dielectric properties, and in particular, a silicon oxide or a silicon nitride may be used. The film thickness of the interlayer insulation film 31 may be selected as appropriate depending on various conditions, and may be in the range from about 100 to 1000 nm.

The contact hole may be formed by etching, such as dry etching or wet etching.

When the substance to be detected is bound to the sensing surface 70s, the potential structure at the sensing surface changes to produce a potential difference between the potential structures before and after the binding. By detecting this potential difference by the oxide semiconductor device, the substance to be detected can be sensed.

This sensor is formed using the semiconductor device of the first embodiment. As described above, the semiconductor device of the first embodiment has excellent device properties. Therefore, the sensor provided with this semiconductor device also has excellent device properties and good sensitivity. It should be noted that the semiconductor device to be used in this embodiment is not limited to the semiconductor device of the first embodiment.

Electro-Optical Device

FIG. 7 is a sectional view of an electro-optical device according to one embodiment of the invention, which illustrates an organic EL device formed using the semiconductor device according to the invention, as an example.

The organic EL device (electro-optical device) of this embodiment includes an active matrix substrate 90 formed by using the oxide semiconductor device T according to the invention, light emission layers 91R, 91G and 91B, which respectively emit red light (R), green light (G) and blue light (B) when a current is applied, formed in a predetermined pattern on the active matrix substrate 90, and a common electrode 92 and a sealing film 93 formed in this order on the light emission layers 91R, 91G and 91B.

In stead of using the sealing film 93, a sealing member, such as a metal can or a glass substrate, may be used to seal the device. In this case, a drying agent, such as calcium oxide, may be included inside.

The light emission layers 91R, 91G and 91B are formed in a pattern corresponding to pixel electrodes 80, which are formed on the oxide semiconductor device T according to the invention, and one pixel is formed by three dots, which respectively emit the red light (R), the green light (G) and the blue light (B). The common electrode 92 and the sealing film 93 are formed over substantially the entire surface of the active matrix substrate 90.

In the organic EL device, one of the pixel electrodes 80 and the common electrode 92 serves as an anode and the other serves as a cathode, and the light emission layers 91R, 91G and 91B emit light by a recombination energy of holes injected via the anode and electrons injected via the cathode.

In order to improve the light emission efficiency, a hole injection layer and/or a hole transport layer may be provided between the light emission layers 91R, 91G and 91B and the anode. In order to improve the light emission efficiency, an electron injection layer and/or an electron transport layer may be provided between the light emission layers 91R, 91G and 91B and the cathode.

The organic EL device of this embodiment, which uses the active matrix substrate 90 formed by using the semiconductor device T according to the invention, has advantages over conventional techniques, such as a reduced power consumption, a reduced formation area of peripheral circuits, and higher freedom of selection of the type of the peripheral circuits. It should be noted that the electro-optical device of the invention is not limited to the organic EL device, and may, for example, be a liquid crystal device.

Effect Of The Invention

In the method for producing a semiconductor device according to the invention, the source electrode and the drain electrode are formed to partially cover the inorganic oxide film, and oxidation treatment is applied to reduce the carrier density only at a region of the inorganic oxide film which is not covered by the source electrode and the drain electrode. Therefore, the source region and the drain region are not oxidized due to the presence of the source electrode and the drain electrode, and are maintained in the low resistance state. As a result, good contact can be provided at connection points between the source electrode and the source region and between the drain electrode and the drain region, thereby improving properties of the semiconductor device employing the inorganic oxide film.

Industrial Applicability

Besides the above-described embodiments, the semiconductor device and the method for producing the semiconductor device according to the invention are also applicable to semiconductor devices, such as a memory device, an amplifier device and a switching device.

What is claimed is:

1. A method for producing a semiconductor device, the method comprising:

forming a gate electrode on a substrate;

forming a gate insulation film on the gate electrode;

forming an inorganic oxide film precursor on the gate insulation film and applying ultraviolet laser light to the inorganic oxide film precursor to form an inorganic oxide film, the inorganic oxide film being positioned above the gate electrode and having a carrier density of $10^{19}/cm^3$ or more;

forming a source electrode and a drain electrode on a different portion of the inorganic oxide film from each other, wherein the source electrode and the drain electrode are in direct contact with the inorganic oxide film and the source electrode and the drain electrode partially covering the inorganic oxide film so as to expose a region of the inorganic oxide film; and applying an oxidation treatment to the exposed region of the inorganic oxide film thereby the exposed region of the inorganic oxide film to have reduced carrier density of $5 \times 10^{16}/cm^3$ or less wherein the inorganic oxide film precursor is formed by a liquid phase method from a liquid comprising an organic solvent and at least one material selected from the group consisting of an inorganic oxide particle, an organic precursor and an organic-inorganic composite precursor.

2. The method for producing a semiconductor device as claimed in claim 1, wherein the inorganic oxide film comprises at least one element selected from the group consisting of In, Zn, Ga and Sn.

3. A method for producing a semiconductor device, the method comprising:

forming a gate electrode on a substrate;

forming a gate insulation film on the gate electrode;

forming an inorganic oxide film on the gate insulation film, the inorganic oxide film being positioned above the gate electrode, and having a carrier density of $10^{19}/cm^3$ or more;

forming a source electrode and a drain electrode by a liquid phase method from an inorganic particle dispersion liquid comprising an organic solvent and an inorganic particle, wherein the source electrode and the drain electrode are formed on a different portion of the inorganic oxide film from each other, the source electrode and the drain electrode are in direct contact with the inorganic oxide film, and the source electrode and the drain electrode partially cover the inorganic oxide film so as to expose a region of the inorganic oxide film; and applying an oxidation treatment to the exposed region of the inorganic oxide film, the source electrode, and the drain electrode, thereby the exposed region of the inorganic oxide film to have the carrier density of $5 \times 10^{16}/cm^3$ or less, wherein the inorganic particles are surface-coated with a dispersant, the dispersant being bound to the inorganic particle via a chemical bond breakable by the oxidation treatment, and wherein the oxidation treatment simultaneously increases the resistance of the exposed region of the inorganic oxide film and decreases the resistance of the source electrode and the drain electrode.

4. The method for producing a semiconductor device as claimed in claim 1, wherein the source electrode and the drain electrode are formed by a liquid phase method from an inorganic particle dispersion liquid comprising an organic solvent and an inorganic particle, the inorganic particle being surface-coated with a dispersant, the dispersant being bound to the inorganic particle via a chemical bond breakable by the oxidation treatment, and the oxidation treatment reduces the carrier density of the exposed region of the inorganic oxide film and a specific resistance value of the source electrode and the drain electrode.

5. The method for producing a semiconductor device as claimed in claim 2, wherein the source electrode and the drain electrode are formed by a liquid phase method from an inorganic particle dispersion liquid comprising an organic solvent and an inorganic particle, the inorganic particle being surface-coated with a dispersant, the dispersant being bound to the inorganic particle via a chemical bond breakable by the oxidation treatment, and the oxidation treatment reduces the carrier density of the inorganic oxide film and a specific resistance value of the source electrode and the drain electrode.

6. The method for producing a semiconductor device as claimed in claim 3, wherein the method for forming the source electrode and the drain electrode using the liquid phase method comprises coating using a liquid jet technique.

7. The method for producing a semiconductor device as claimed in claim 3, wherein the inorganic particle comprises, as a main component, at least one inorganic substance selected from the group consisting of Au, Ag, Cu, Pt, Ni, Cr, Rh, Pd, Zn, Co, Mo, Ru, W, Os, Ir, Fe, Mg, Y, Ti, Ta, Nb, Mn, Ge, Sn, Ga, Al, In, and alloys and oxides thereof.

8. The method for producing a semiconductor device as claimed in claim 1, wherein the oxidation treatment applies, under the presence of oxygen, at least one treatment selected from oxygen radical treatment and heat treatment.

9. The method for producing a semiconductor device as claimed in claim 1, wherein the substrate comprises a resin substrate.

10. A semiconductor device produced by the method as claimed in claim 1.

11. A sensor comprising the semiconductor device as claimed in claim 10.

12. An electro-optical device comprising the semiconductor device as claimed in claim 10.

* * * * *